United States Patent [19]
Berkcan et al.

[11] Patent Number: 6,018,239
[45] Date of Patent: *Jan. 25, 2000

[54] SELF-POWERED AXIAL CURRENT SENSOR

[75] Inventors: Ertugrul Berkcan, Schenectady, N.Y.; Raymond Kelsey Seymour, Plainville, Conn.; Jerome Johnson Tiemann, Schenectady, N.Y.

[73] Assignee: General Electric Company, Schenectady, N.Y.

[ * ] Notice: This patent issued on a continued prosecution application filed under 37 CFR 1.53(d), and is subject to the twenty year patent term provisions of 35 U.S.C. 154(a)(2).

[21] Appl. No.: 08/735,719

[22] Filed: Oct. 23, 1996

[51] Int. Cl.$^7$ .............................. G01R 1/20; H01F 27/00
[52] U.S. Cl. ........................... 324/127; 336/175; 336/211
[58] Field of Search ..................... 324/127, 126, 324/117 R; 336/174, 175, 176, 211

[56] References Cited

U.S. PATENT DOCUMENTS

| | | |
|---|---|---|
| 1,953,779 | 4/1934 | Sclater et al. . |
| 2,724,821 | 11/1955 | Schweitzer, Jr. ................... 324/127 |
| 3,170,133 | 2/1965 | Kernick . |
| 3,579,280 | 5/1971 | Florance et al. ................... 324/127 |
| 4,074,193 | 2/1978 | Kohler ................................. 324/126 |
| 4,158,810 | 6/1979 | Leskovar ............................ 324/127 |
| 4,709,205 | 11/1987 | Baurand et al. ................... 324/127 |
| 4,808,917 | 2/1989 | Fernandes et al. ................ 324/127 |
| 4,831,327 | 5/1989 | Chenier et al. ................... 324/127 |
| 4,978,906 | 12/1990 | Herbert et al. . |

FOREIGN PATENT DOCUMENTS

| | | |
|---|---|---|
| 2432919 | 2/1976 | Germany . |
| 19505812 | 8/1996 | Germany . |

OTHER PUBLICATIONS

Ramboz, J.D., "Machinable Rogowski Coil, Design and Calibration", IEEE IMTC/95, Waltham, MA, Apr. 23–26, 1995–Institute of Electrical & Electronic Engineers, Apr. 23, 1995, pp. 329–334.

"Clamp–On 'Donut' Measures Power Line Load", 903 Machine Design 60 Dec. (1988), No. 29., Cleveland, Ohio, U.S., pp. 54–55.

*Primary Examiner*—Ernest Karlsen
*Attorney, Agent, or Firm*—Marvin Snyder; Douglas E. Stoner

[57] ABSTRACT

A self-powered axial current sensor for generating a signal which accurately represents current in a power line includes, in one embodiment, a housing having a bus bar opening of substantially rectangular shape extending longitudinally therethrough. The housing also includes current sensor core retaining walls which define a current sensor region, and a cover base wall which defines, with one of the retaining walls, a power core region. A current sensor core and coil are located in the current sensor region and are positioned proximate the bus bar opening. The current sensor core and coil also are substantially symmetrical with respect to the center axis of the bus bar opening. The current sensor further includes a power core and a power coil located in the power core region and positioned substantially symmetrically with respect to the center axis of bus bar opening.

19 Claims, 8 Drawing Sheets

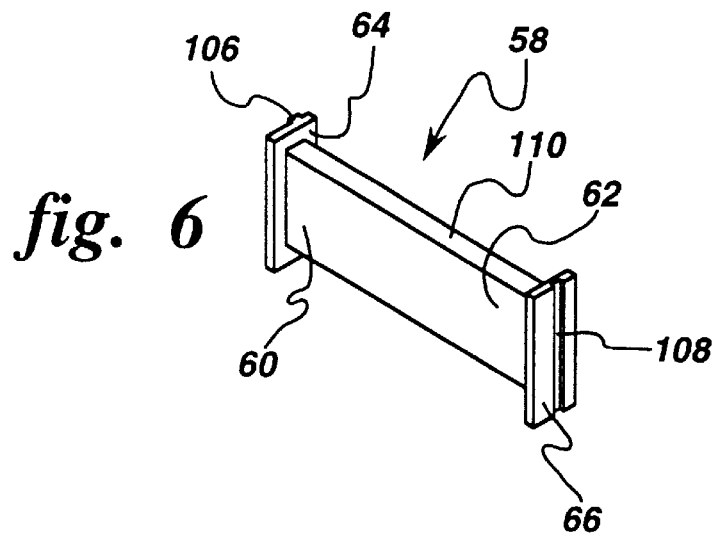
*fig.* 6
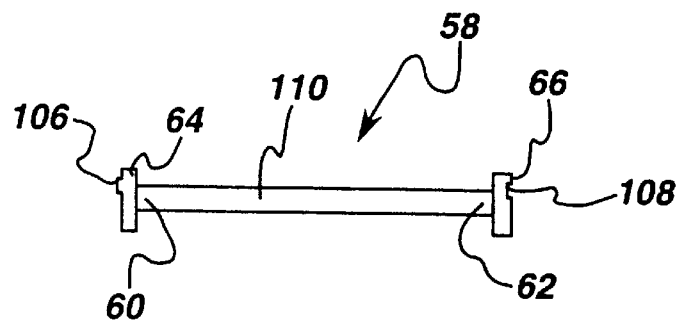
*fig.* 7
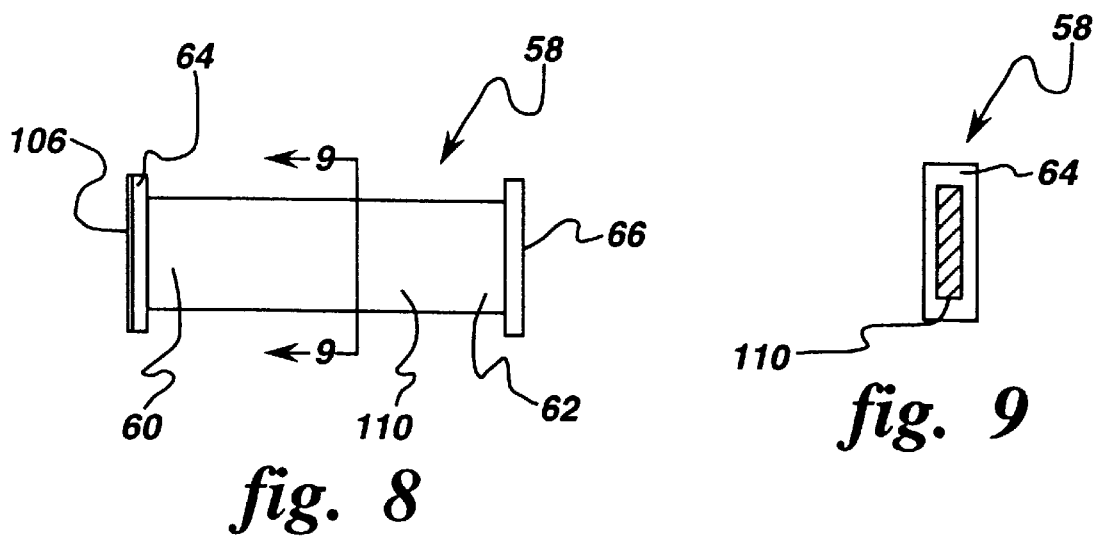
*fig.* 8
*fig.* 9

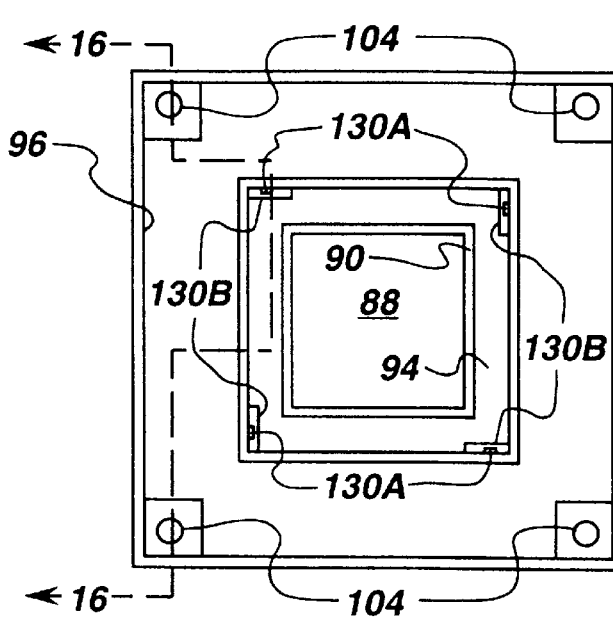
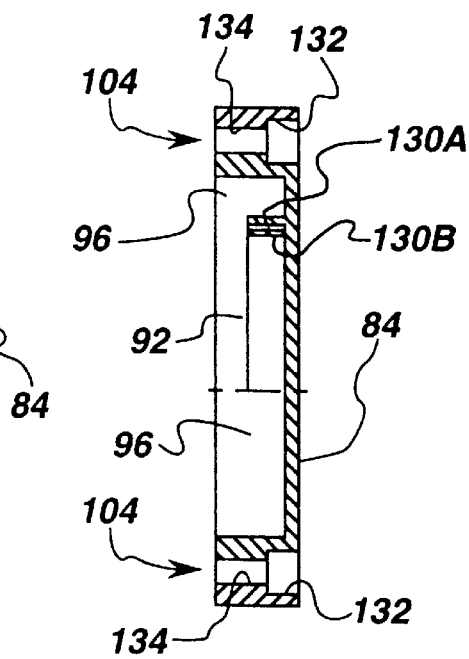
fig. 15          fig. 16
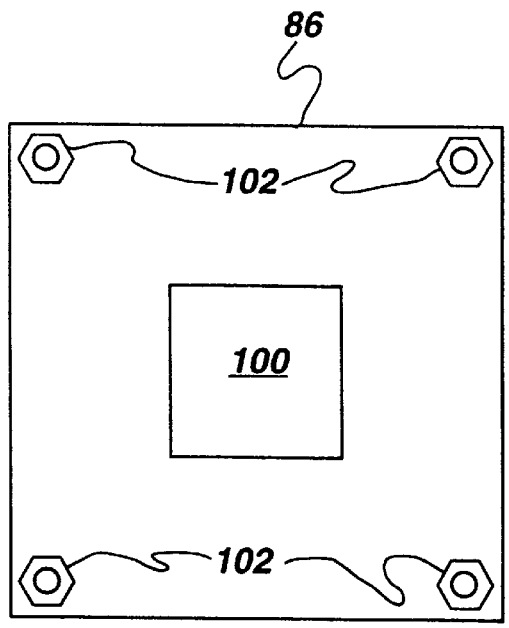
fig. 17

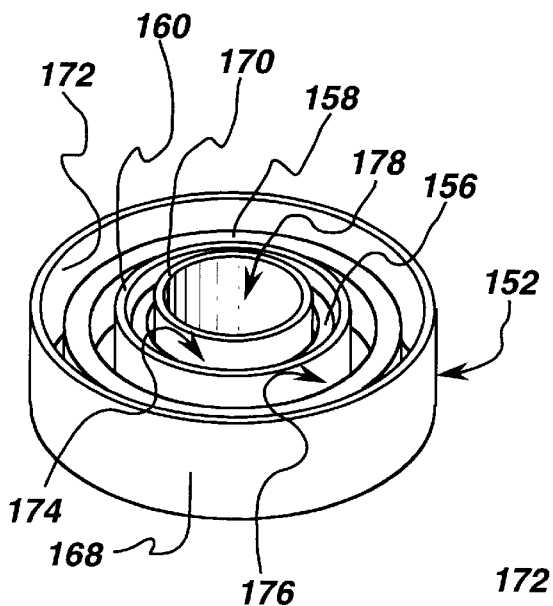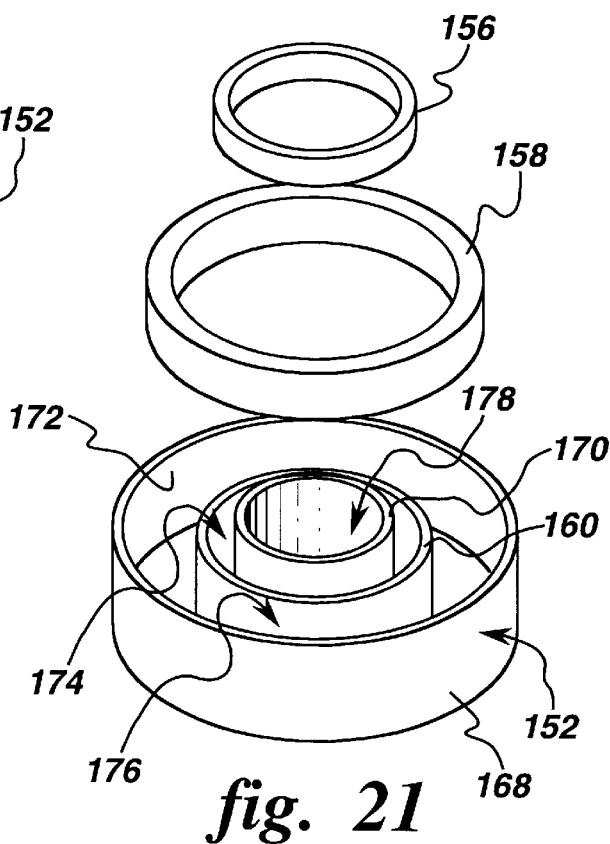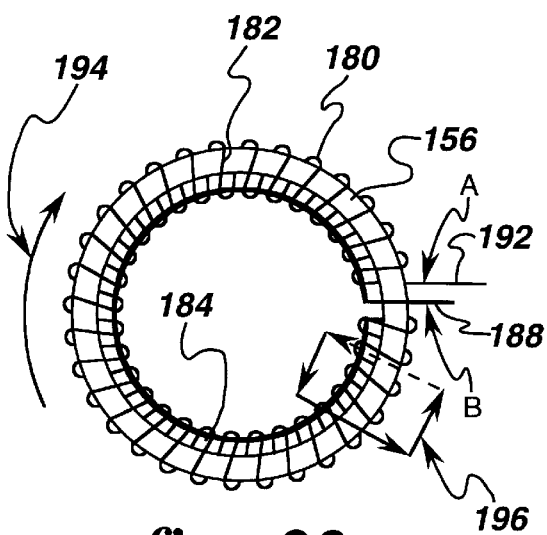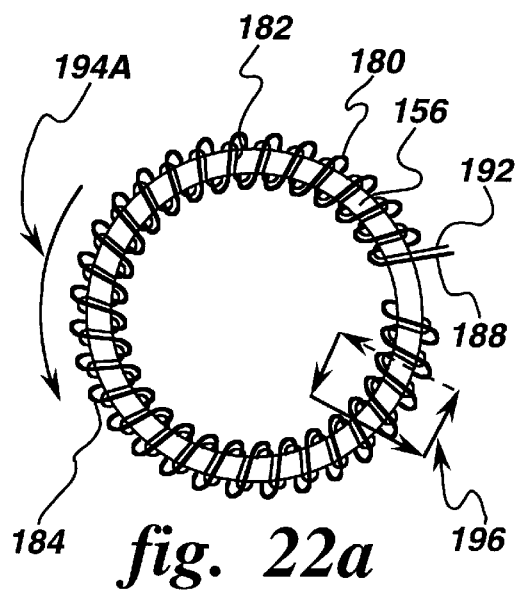

SELF-POWERED AXIAL CURRENT SENSOR

FIELD OF THE INVENTION

This invention relates generally to sensing power line current and, more articularly, to self-powered axial current sensors for use in circuit breakers.

BACKGROUND OF THE INVENTION

A power distribution system typically includes components such as circuit breakers, transformers and power lines. A typical circuit breaker includes sensors for identifying transients in the power line current and controls to trip the breaker, i.e., open the breaker, so as to open a particular branch of the system at the proper instant.

Current sensors conventionally used in circuit breakers and other power system components require complex fabrication techniques and hence are expensive in terms of both material and labor costs. For example, current sensors typically employ a copper wound iron core for sensing current. The core generally must be machined to within very limited tolerances. Materials such as copper and laminated magnetic quality steel, requiring very tight manufacturing tolerances, account for much of the material and labor costs of the sensor.

In reducing the core material size, thus reducing assembly costs of a current sensor, the sensor accuracy preferably is not adversely affected. Accurate current sensing is often required in circuit breaker applications utilizing digital display and metering. Inaccurate current sensing could lead, detrimentally, to unnecessarily cutting-off power to a load and introducing discrepancies in power metering.

In addition to high accuracy and low cost, the size of current sensors is often important. For example, if an existing product must be redesigned in order to accomodate a new current sensor, the cost of adding the new current sensor to the product can be very expensive. Preferably, any new current sensor is sized so that it can be easily installed into the existing product, such as a circuit breaker.

Since many power system components do not include batteries, the current sensor preferably is also self-powered. This generally means that any power required by the current sensing circuit and other electronic components in the breaker unit is provided by the power line being monitored. Avoiding use of an external battery not only avoids adding to the initial cost of the sensor, i.e., the added cost of the battery, but the power system components do not rely on battery power to provide protection if any overcurrent condition exists and the breaker must trip. Use of a self-powered current sensor thus facilitates achievement of high reliability operation.

It would be desirable, therefore, to provide a relatively low cost current sensor which is of reduced fabrication complexity as compared to known current sensors, and is sized so that it can be used in existing circuit breakers. In addition, such low cost current sensor must operate with high accuracy to sense current in a power line, and preferably is self-powered.

SUMMARY OF THE INVENTION

A self-powered axial current sensor for generating a signal which accurately represents current in a power line is structured so that the sensing and self-power functions are separate. Separation of the sensing and self-powering functions allows high accuracy sensing to be performed using a low cost sensor.

In one embodiment, the current sensor includes a housing having a bus bar opening of substantially rectangular shape extending therethrough. The housing also includes current sensor core retaining walls which define a current sensor region, and a cover base wall which defines, with one of the retaining walls, a power core region. The housing is constructed, e.g., molded, from electrically insulating material such as plastic.

A current sensor core and coil are located in the current sensor region and are positioned proximate the bus bar opening so that the core and coil are substantially symmetric with respect to the center axis of the bus bar opening. The current sensor is segmented by equilateral bobbin winding segments. The current sensor core, in one embodiment, is formed of four bobbins, each having first and second ends and a substantially rectangular cross-sectional shape. Each bobbin also has a first and second flanges, each including an interlocking member which facilitates both magnetic coupling and arrangment of the bobbins in a substantially rectangular configuration to form the current sensor core. The bobbins are constructed of an electrically insulating material, such as plastic, with a permeability substantially equal to that of air. This current sensor coil is formed by windings wrapped on the current sensor core. The current sensor core and coil construction permits a highly symmetrical sensor coil to be formed without requiring a toroidally wound core. In addition, the plastic core facilitates increased accuracy, dynamic range, linearity, and frequency response of the sensor.

The current sensor also includes a self-powering core and a self-powering coil positioned substantially symmetrically with respect to the center axis of the bus bar opening. The self-powered core is formed, in one embodiment, of separate c-cores held together by straps to minimize air gaps between the mating c-cores. The c-cores are formed of a plurality of iron laminations. Two bobbins are situated on opposing legs of the power core, and the c-cores extend through longitudinal bores in each bobbin. The power coil bobbins are formed of electrically insulating material, such as plastic. The power coil is formed by windings wrapped on the power coil bobbins. This self-powering core construction enables use of low-cost bobbin wound coil segments, yet is a symmetrical design for improved performance.

To monitor current in a power line, the power line is electrically coupled to a bus bar positioned so that it extends through the current sensor bus bar opening. When the current sensor and bus bar are assembled as described above, the current sensor core and coil and the self-powered core and coil are substantially symmetrical with respect to the bus bar. This symmetry can provide superior accuracy compared to unsymmetrical coils.

In operation, the magnetic field generated by current in the bus bar induces a voltage in the current sensor coil and a current in the self-power coil. The induced voltage in the current sensor coil is proportional to the time rate of change of the current in the power conductor, and is provided to a sensing circuit which generates an output signal used for controlling the power system. The induced current in the self-power coil is used to energize the sensing circuit components as well as any additional components of the breaker unit, such as, for example, a power rectifier and control circuit which, in turn, may be connected to supply power to other components of the unit.

The above described current sensor, which is of relatively small size, is useful in various applications such as in circuit breakers, and can provide an accurate signal representative of current in a power conductor while being capable of fabrication at low material and assembly costs.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

FIG. 6 is a perspective view of the current sensor coil bobbin used in the current sensor shown in FIG. 1.

FIG. 7 is a top view of the current sensor coil bobbin shown in FIG. 6.

FIG. 8 is a side view of the current sensor coil bobbin shown in FIG. 7.

FIG. 9 is a cross-sectional view along line 9—9 shown in FIG. 8.

FIG. 15 is a top view of the bottom cover shown in FIG. 3.

FIG. 16 is a cross-sectional view along line 16—16 shown in FIG. 15.

FIG. 17 is a top view of the current sensor cover shown in FIG. 3.

FIG. 20 is a perspective view of the bottom cover of the current sensor shown in FIG. 18.

FIG. 21 is an exploded view of the current sensor shown in FIG. 18.

FIG. 22 illustrates winding the sensing coil on the sensing coil core for the current sensor shown in FIG. 18.

FIG. 22a illustrates winding the second layer of a two-layer sensing coil on the sensing coil core for the current sensor shown in FIG. 18.

DETAILED DESCRIPTION OF THE DRAWINGS

Figure 1:
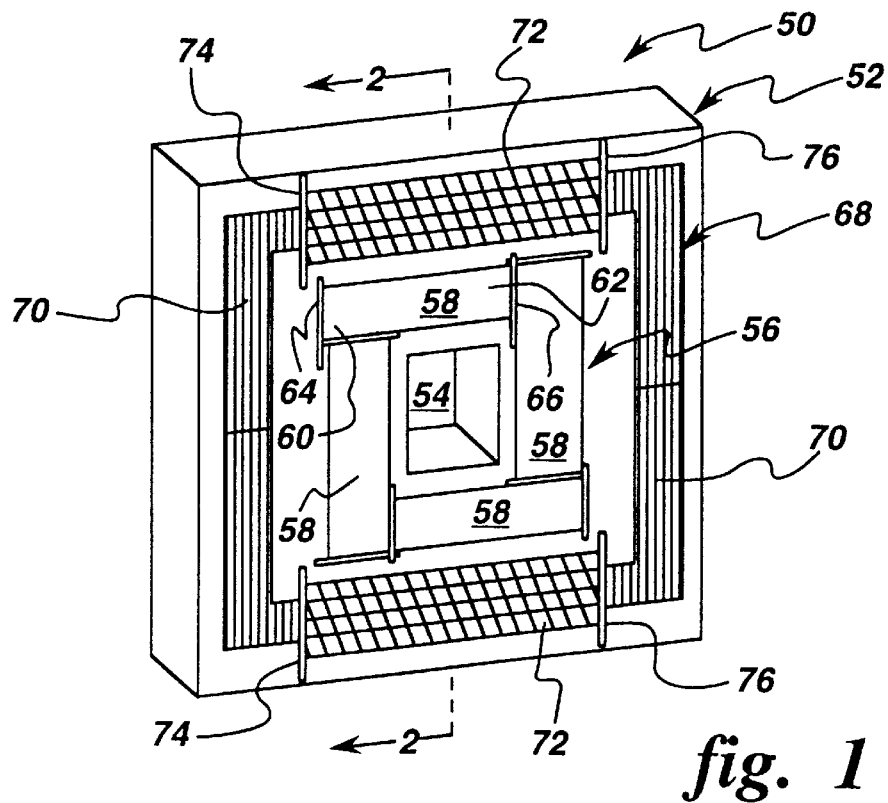
FIG. 1 is a perspective view of a self-powered axial current sensor in accordance with one embodiment of the present invention.

FIG. 1 is a perspective view of a self-powered axial current sensor 50 in accordance with one embodiment of the present invention. Current sensor 50 includes a housing 52 having a bus bar opening 54 extending therethrough. Bus bar opening 54 is substantially rectangular shaped. Housing 52 is constructed, e.g., molded, from electrically insulating material such as plastic.

A current sensor core 56 is positioned proximate bus bar opening 54 and is symmetric about a center axis (not shown) passing longitudinally through opening 54. Core 56 is formed of four bobbins 58, each having a first end 60 and a second end 62, and each having a substantially rectangular cross-sectional shape. Each bobbin 58 also has a first flange 64 and a second flange 66. As described hereinafter in more detail, first and second flanges 64 and 66 include interlocking members which facilitate arranging bobbins 58 to form core 56. Bobbins 58 also are constructed from an electrically insulating material such as plastic.

Current sensor 50 also includes a self-power core 68 positioned substantially symmetrically with respect to the center axis of opening 54. Self-power core 68 includes, in one embodiment, separate c-cores 70 held together by aluminum or other non-magnetic material straps (not shown). C-cores 70 are, for example, formed by a plurality of iron laminations. The C-cores extend through longitudinal bores (not shown) in power coil bobbins 72, and each bobbin 72 includes first and second flanges 74 and 76. Bobbins 72 are formed from electrically insulating material such as plastic.

Figure 2:
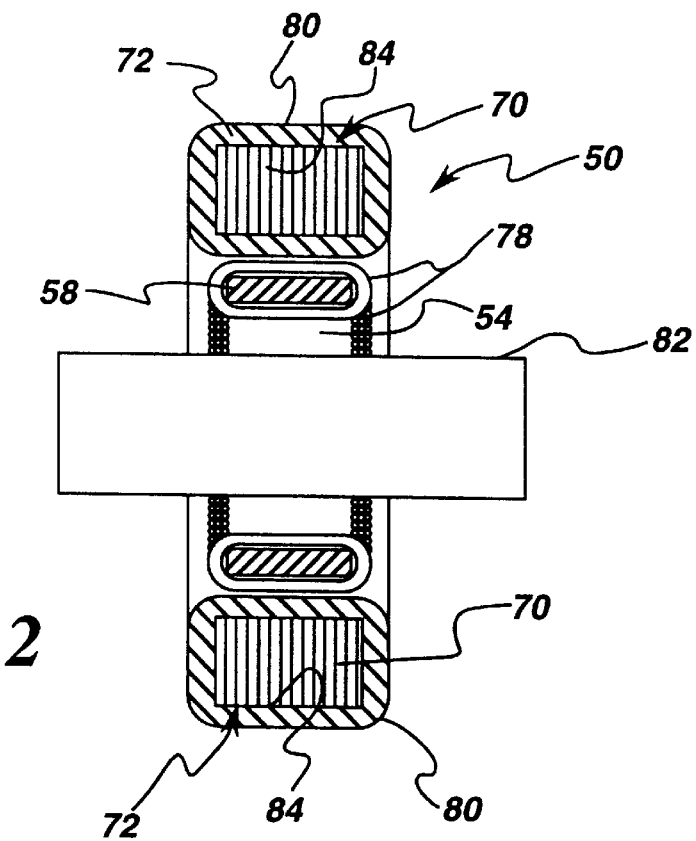
FIG. 2 is a cross-sectional view of the current sensor shown in FIG. 1.

FIG. 2 is a cross-sectional view of current sensor 50 as viewed through a plane taken along line 2—2 shown in FIG. 1, with a bus bar 82 shown extending through opening 54. Current sensing windings 78 are shown on current sensing bobbins 58, respectively, and power windings 80 are shown on power bobbins 72, respectively. Steel laminations of c-cores 70 extending through bores 84 in power bobbins 72 also are illustrated in FIG. 2. The formation of windings 78 and 80 is described hereinafter in more detail.

Figures 3, 4, 5:
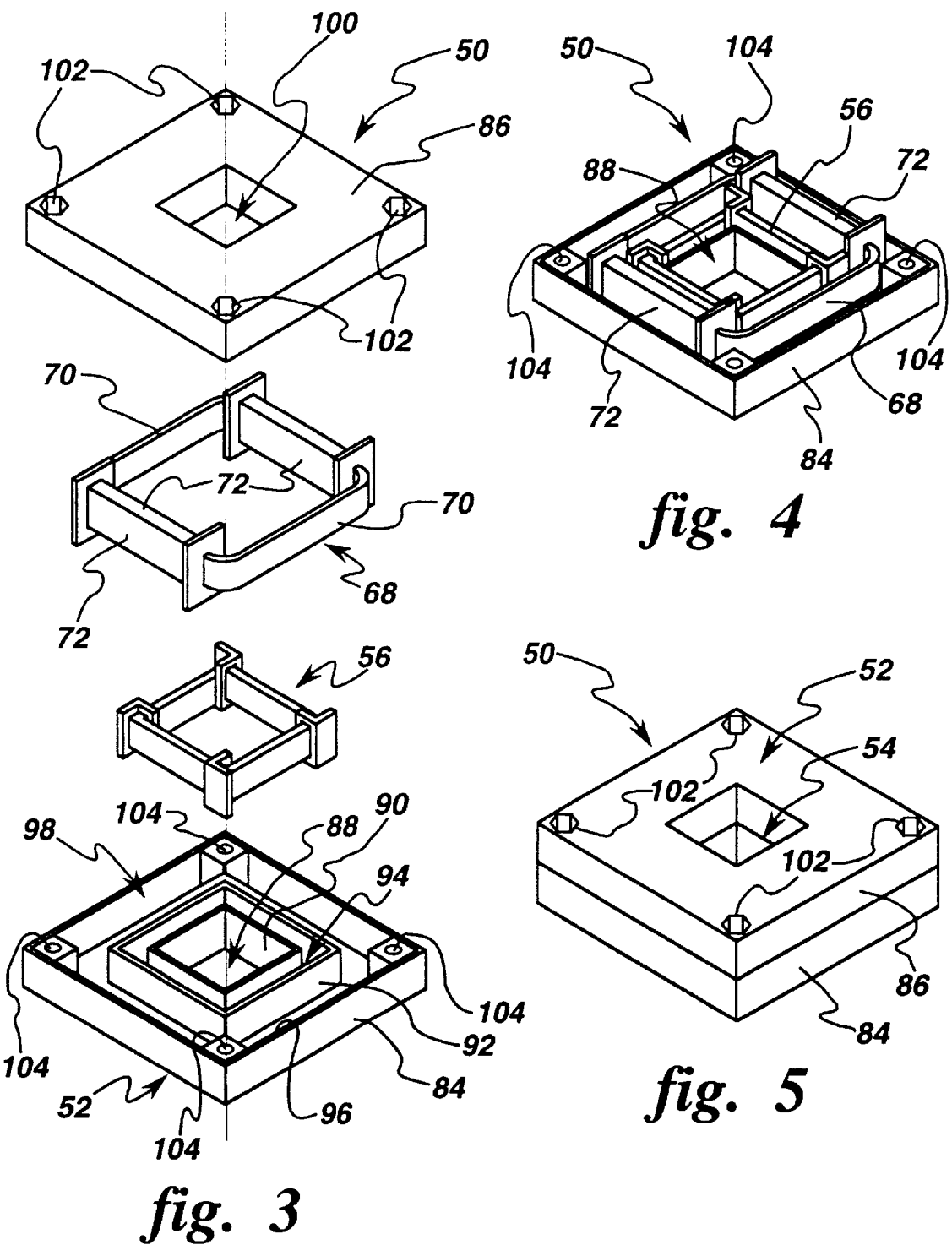
FIG. 3 is an exploded view of the current sensor shown in FIG. 1.
FIG. 4 is a perspective view of the current sensor shown in FIG. 3 without the top cover.
FIG. 5 is a perspective view of a fully assembled current sensor in accordance with the embodiment shown in FIG. 1.

FIG. 3 is an exploded view of current sensor 50. Sensor 50 includes a housing 52 having a substantially rectangular-shaped base 84 and cover 86. Base 84 includes a bus bar opening 88, and retaining walls 90 and 92 are formed in base 84 and define a current sensor region 94. Walls 90 and 92 facilitate retaining core 56 in position with respect to bus bar opening 88. Retaining wall 92 and a base wall 96 define a power core region 98. Power core 68 (including power windings not shown in FIG. 2) is located in power coil region 98. Power core 68 and current sensor core 56 are separated, electrically, by retaining wall 92. Such separation between power core 68 and current sensing core 56 facilitates preventing electrical interference between self-power core 68 and current sensing core 56.

Cover 86 includes a bus bar opening 100, and openings 102 in cover 86 align with respective openings 104 in base 84. Threaded bolts (not shown) are inserted through aligned openings 102 and 104, and threadingly engage with base openings 104 to maintain cover 86 in engagement with base 84.

FIG. 4 illustrates housing base 84 having current sensing core 56 and power core 68 positioned therein. Cover 86 is not placed over base 84. As shown in FIG. 4, current sensing core 56 is electrically separated from power core 68. Also, current sensing core 56 and power core 68 are substantially symmetrical with respect to bus bar opening 88.

Current sensor 50 is shown in a completely assembled configuration in FIG. 5. The power core (not shown) and current sensing core (not shown) are completely enclosed within housing 52. Bus bar opening 54, formed by openings 88 (in base 84) and 100 (in cover 86), extends through sensor 50.

FIG. 6 is a perspective view of one current sensor coil bobbin 58 used in the current sensor shown in FIG. 1. Bobbin 58, as described above, has a first end 60 and second end 62, and bobbin 58 has a substantially rectangular cross sectional shape. Bobbin 58 also includes first and second flanges 64 and 66 as described above, which include interlocking members 106 and 108, respectively, to facilitate arranging bobbins 58 to form core 56 (FIG. 3). Bobbin 58 also includes an elongate main body member 110.

FIG. 7 is a top view of current sensor coil bobbin 58 shown in FIG. 6. Interlocking member 106 of first flange 64 is a male type member that includes a protrusion. Interlocking member 108 of second flange 66 is a female type member that includes a slot. The slot of each female interlocking member 108 receives an edge of first flange 64 of an adjacent bobbin 58. In this manner, such interlocking members (e.g., flange 64 and female interlocking member 108) cooperate to retain bobbins 58 configured to form core 56.

FIG. 8 is a side view of current sensor coil bobbin 58 shown in FIG. 7. As shown in FIG. 8, protrusion of male interlocking member 106 extends the entire length of flange 64. Such configuration facilitates retaining bobbins 58 in the selected configurations.

FIG. 9 is a cross section view through line 9—9 shown in FIG. 8. As shown in FIG. 9, bobbin 58 has a substantially rectangular cross-sectional shape and main body member 110 is substantially solid along its length.

Figure 10:
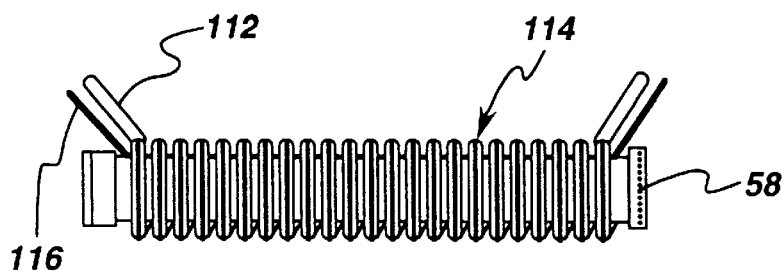
FIG. 10 illustrates forming the current sensor windings on the current sensor coil bobbin shown in FIG. 6.

FIG. 10 illustrates winding of a conductor 112 on current sensor coil bobbin 58 to form a current sensing coil 114. As shown in FIG. 10, main current sensing winding, or coil, 114 is wound in a clockwise direction around bobbin 58. A compensating turn winding 116 is placed on bobbin 58 and extends the longitudinal length of bobbin 58. Main current sensing winding 114 is wound over compensating turn winding 116.

Figure 11:
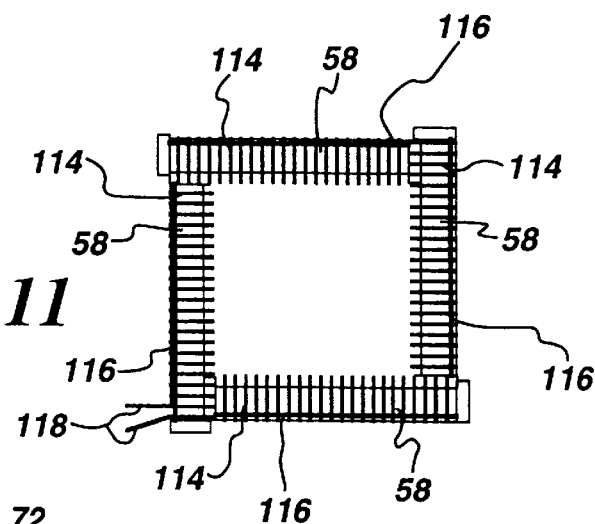
FIG. 11 illustrates an assembly of four (4) wound current sensor coil bobbins.

FIG. 11 illustrates four (4) wound current sensor coil bobbins 58 arranged to form current sensing core 56. Main current sensing windings 114 on each bobbin 58 are electrically connected in a series aiding arrangement. Compensating turn windings 116 of each bobbin also are electrically connected in a series aiding arrangement. Leads 118 extend from sensing core 58 and are coupled, for example, to an analog to digital converter (not shown) of a digital integrator circuit.

Figure 12:
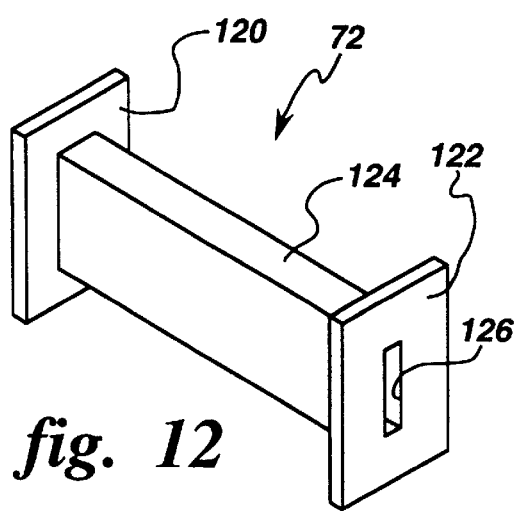
FIG. 12 is a perspective view of the power coil bobbin used in the current sensor shown in FIG. 1.

FIG. 12 is a perspective view of one power coil bobbin 72 in current sensor 50 shown in FIG. 1. Bobbin 72 includes first and second substantially planar flanges 120 and 122, and a main body member 124 having a substantially rectangular cross-sectional shape. A rectangular shaped opening 126 is formed in flanges 120 and 122 and a bore (not shown) extends through bobbin 72. The bore is sized to receive a portion of c-core 70 as illustrated in FIG. 1.

Figure 13:
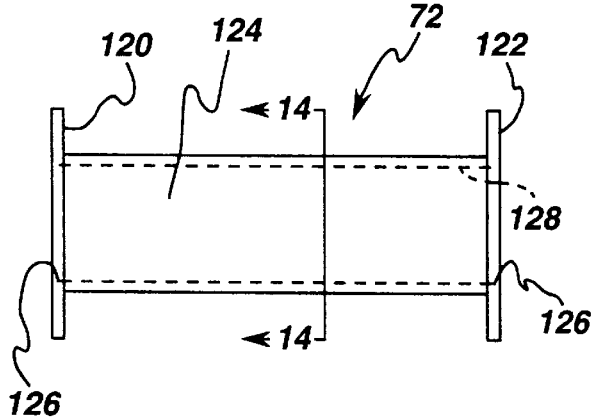
FIG. 13 is a side view of the power coil bobbin shown in FIG. 12.

FIG. 13 is a side view of power coil bobbin 72 shown in FIG. 12. As shown in FIG. 13, bore 128 extends through bobbin 72. Power coil windings (not shown) are wound on bobbin 72 along the length of main body member 124. A conductor, e.g., copper wire, can be used to form such windings.

Figure 14:
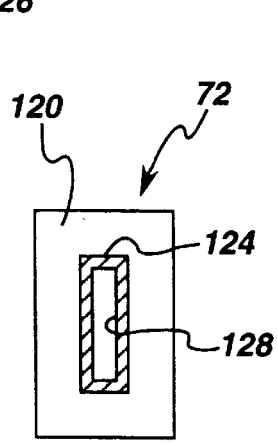
FIG. 14 is a cross-sectional view along line 14—14 shown in FIG. 13.

FIG. 14 is a cross-sectional view of power coil bobbin 72 taken along line 14—14 shown in FIG. 13. Bore 128 is aligned with opening 126 in flange 120 and c-core 70 (not shown) extends through bore 128 and openings 126 as described above.

FIG. 15 is a top view of base 84 shown in FIG. 3. Base 84 includes retaining walls 90 and 92 defining current sensor region 94. Protrusions 130A and 130B formed by retaining wall 92 are used for situating core 56 in the desired position within current sensor region 94. Specifically, protusions 130 cooperate with male interlocking members 106 of bobbins 58 (FIG. 6) to facilitate positioning core 56 in region 94. Protrusions 130B serve as stops so that bobbins 58 are supported in region 94 to allow air flow completely around sensor coils 78.

FIG. 16 is a cross-sectional view of base 84 taken along line 16—16 shown in FIG. 15. Openings 104 in the base include a first larger diameter portion 132 and a second smaller diameter portion 134. First larger diameter portion 132 is sized to receive the head of a threaded bolt so that a bolt does not extend beyond the periphery of base 84. Also shown in FIG. 16 is one protrusion 130 of retaining wall 92 for positioning core 56 in a desired position.

FIG. 17 is a top view of current sensor cover 86 shown in FIG. 3. Openings 102 are sized to receive hex nuts and substantially round bolt heads as shown. Such arrangement facilitates maintaining cover 86 engaged to base 84.

Current sensor 50 can be used in various applications, such as circuit breaker applications, at low material and assembly costs. For example, housing 52 and current sensor core 56 are molded, in one embodiment, from a plastic. Use of such low cost material holds down sensor costs. With respect to assembly labor, current sensor core 56 and power coil core 68, including their respective windings, are easily and quickly positioned within housing 52. Cover 86 is then positioned over base 84 and engaged thereto using threaded bolts. Such ease of assembly facilitates automation of the assembly process and further enables realization of cost savings.

To monitor current in a power line, the power line is electrically coupled to a bus bar positioned to extend through bus bar opening 54 in current sensor 50 so that current sensor core 56 and coil 78, and power core 68 and coil 80, are substantially symmetrical with respect to the bus bar.

The magnetic field generated by current in the bus bar induces a voltage in current sensor coil 78 and also induces a current in power coil 80. The induced voltage in current sensor coil 78 is proportional to the time rate of change of the current in the power conductor and is provided to a sensing circuit which generates an output signal used for controlling the power system.

The induced current in power coil 80 is used to energize the sensing circuit components. For example, power coil 80 may be electrically connected to a power rectifier and control circuit which, in turn, may be connected to supply power to other components of the unit.

In current sensor 50, the sensing and self-powering functions are separated so as to facilitate high accuracy current sensing at a low cost. Sensing core 56, i.e., an air core, can provide increased accuracy, dynamic range, linearity, and frequency response. In addition, self-power core 68 is a low cost, saturable, core which prevents overcurrent generation and enables low power consumption by the breaker unit. Moreover, magnetic cross-talk and magnetic coupling can be minimized by locating sensing core 56 within self-power core 68.

Since sensing core 56 is symmetric with respect to bus bar 82, accuracy of sensor 50 is enhanced. Self-power core 68 does not necessarily have to be symmetric about bus bar 82 to provide the magnetic shielding as described above. The geometric shape of the sensing core, of course, is not limited to the rectangular shape described in connection with sensor 50 in order to be symmetrical with the bus bar since it may be, for example, rectangular, polygonal, or circular.

Figure 18:
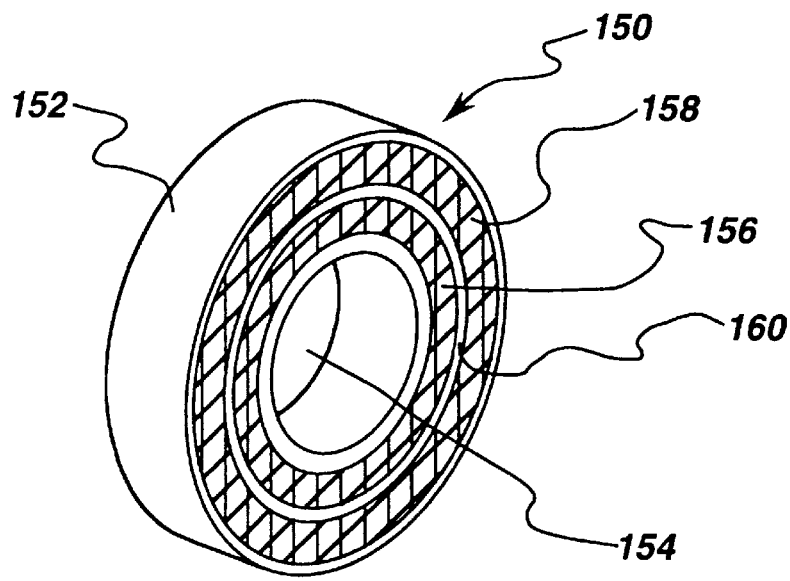
FIG. 18 is a perspective view of a self-powered axial current sensor in accordance with another embodiment of the present invention.

FIG. 18 is a cross-sectional perspective view of a self-powered axial current sensor 150 having a circular shape in accordance with another embodiment of the invention. The sensor includes a housing 152 having a power line opening 154 of substantially cylindrical shape extending therethrough. Housing 152 is molded from an electrically insulating material such as plastic. A toroidal sensing coil core 156 is positioned proximate opening 154 and is symmetric about a center axis (not shown) of opening 154. Sensing core 156 is formed from a plastic or other insulating material. A toroidal power-up core 158 having a diameter greater than the diameter of sensing core 156 also is positioned symmetrically about the center axis of opening 154. Sensing core 156 is separated physically and electrically from power-up core 158 by a retaining wall 160.

Figure 19:
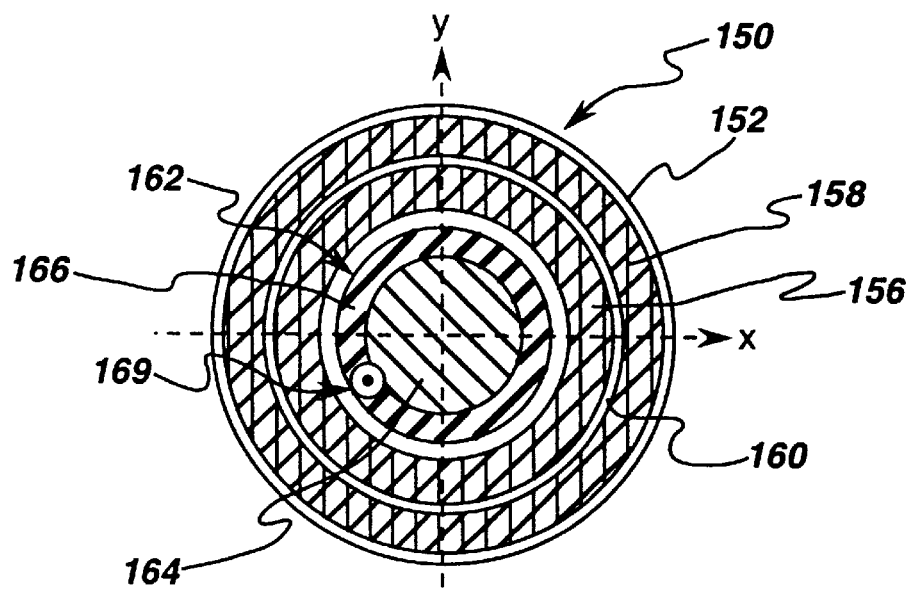
FIG. 19 is a cross-sectional view of the current sensor shown in FIG. 18.

FIG. 19 is a cross-sectional front view of current sensor 150 shown in FIG. 18. A power line 162 including a conductor portion 164 and an insulating portion 166 is shown passing through central power line opening 154. Current direction (i.e., out of the plane of the page) is indicated on power line 162 by an oncoming arrowhead 169. Cores 156 and 158 are substantially symmetrically located with respect to power line 162.

FIG. 20 is a perspective view of a base 168 of housing 152 including cores 156 and 158 positioned therein. Base 168 includes sensing coil retaining rings, or retaining walls, 160 and 170, and a base wall 172. Current sensor core 156 is positioned within a current sensor core region 174 defined by retaining walls 160 and 170, and power-up core 158 is positioned within a power-up core region 176 defined by retaining wall 160 and base wall 172. Base 168 also includes a substantially cylindrical shaped opening 178 extending longitudinally therethrough.

FIG. 21 is an exploded view of current sensor base 168 and cores 156 and 158 shown in FIG. 18. As shown in FIG. 21, current sensing core 156 is smaller in diameter than power-up core 158. Cores 156 and 158 are easily and quickly assembled in base 168 by simply locating power-up core 158 in region 176 and locating sensing core 156 in region 174. Although not shown for simplicity of illustration, a cover is engaged to base 168 with an opening aligned with opening 178. Optionally, housing 152 can be potted with a suitable epoxy or silicon compound.

FIG. 22 illustrates winding of a current sensing coil 180 on current sensing core 156. The core material is constructed with a permeability substantially equal to that of air. Specifically, a conductor 182 is wound around core 156 over a compensating turn 184, forming coil 180. More specifically, a compensating turn conductor 184, which has a start end 188, is arranged circumferentially on core 156, while winding conductor 182 includes a start end 192. Compensating turn conductor 184 is retained under winding conductor 182. As core 156 is rotated clockwise, as indicated by a directional arrow 194, conductor 182 is wound around core 156 in the path indicated by arrows 196. Although not illustrated, the power-up coil is formed by wrapping a conductor, such as a copper conductor, around the power-up core, constructed of magnetic material, along its length.

The compensating turn 184 is used for the rejection of magnetic fields that have a component orthogonal to the plane of the windings. The preferred construction of the coil and compensating turn depends upon the number of layers. In the case of a single layer as shown in FIG. 22, the compensating turn 184 is a single turn of wire laid out on the inside of the coil bobbin. This compensating turn has the effect of removing the loop corresponding to the single turn loop that would be created by the loop A-B; otherwise, this loop would be sensitive to magnetic fields with a component orthogonal to the plane of the coil. Since there are various stray magnetic fields created by various parts of the conductors, it is desirable that a compensating turn be used. The area of the single-turn loop A-B is much larger than the area of the multiple turns created on the bobbin in order to offset what would otherwise be a noise signal comparable to the signal obtained from the sensing coil. The compensating turn is preferably placed in the center of the toroidal cross section at the mean radius, or at the internal perimeter of the bobbin.

A better compensating turn is obtained in the case of two (or an even number of) winding layers that are wound in a particular fashion, as shown in FIG. 22a where, for the second layer, the windings are continued in the same direction around as the first layer, but the bobbin is rotated in a direction 194A opposite to that of the first layer. This approach guarantees that the signals from the two winding layers are additive. The second layer automatically forms a compensating turn 184 since the wire and the connection are again brought to starting point 188. In this case, however, the compensating turn is much closer to the windings of the first layer than in the case of a single turn of wire on the inside perimeter of the bobbin. In the case of two layers thus wound, the composite effects of pitch advancement are largely nullified.

Figure 23:
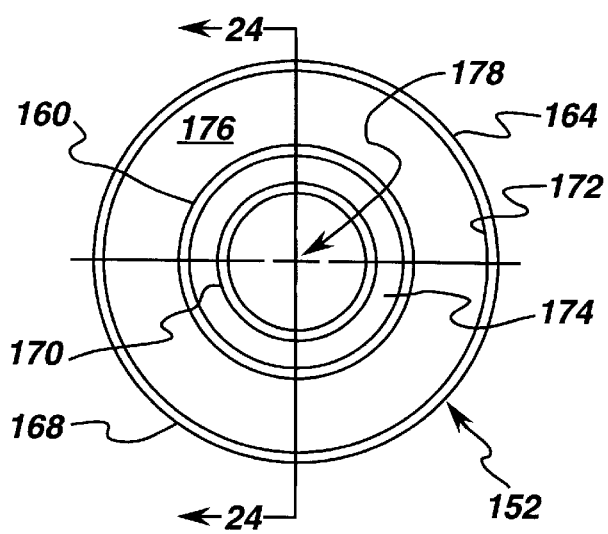
FIG. 23 is a top view of the bottom cover of the current sensor shown in FIG. 20.

FIG. 23 is a top view of base 168 shown in FIG. 20, and includes current sensing core receiving region 174 and power-up core receiving region 176. Retaining walls 160 and 170 define the periphery of current sensing core receiving region 174, and retaining wall 160 and base wall 172 define the periphery of power-up core receiving region 176.

Figure 24:
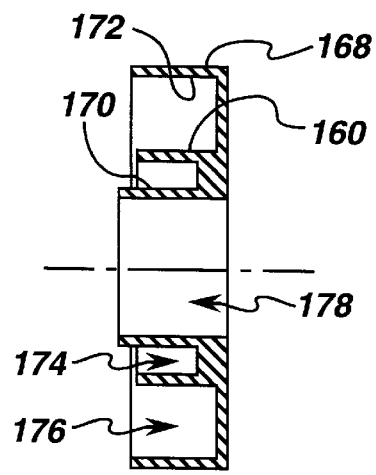
FIG. 24 is a cross-sectional view along line 24—24 shown in FIG. 23.

FIG. 24 is a cross-sectional view of base 168 taken along line 24—24 shown in FIG. 23. As shown in FIG. 24, current sensing core receiving region 174 is separated from power-up core receiving region 176 by wall 170. Regions 174 and 176 are symmetrical with respect to opening 178.

Figure 25:
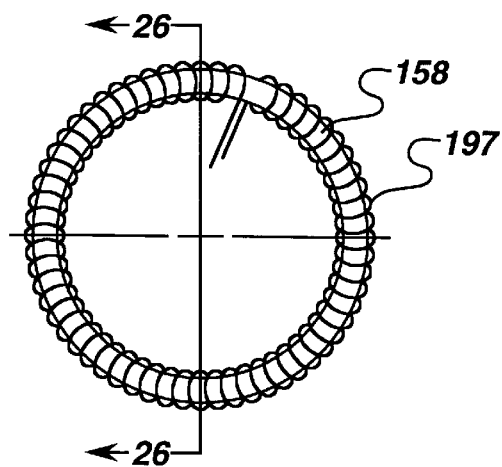
FIG. 25 is a top view of the power coil core for the current sensor shown in FIG. 18.
Figure 26:
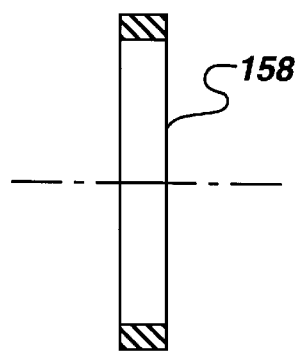
FIG. 26 is a cross-sectional view along line 26—26 shown in FIG. 25.

FIG. 25 is a top view of power-up core 158. Power-up core 158 is substantially ring-shaped and is formed by a plurality of stacked laminations, as described above, or tape-wound core material. FIG. 26 is a cross-sectional view of power-up core 158 taken along line 26—26 shown in FIG. 25. The core may be coated with suitable insulating material such as epoxy. Winding 197 is situated toroidally about the core to 158 to provide power for electronics requirements.

Figure 27:
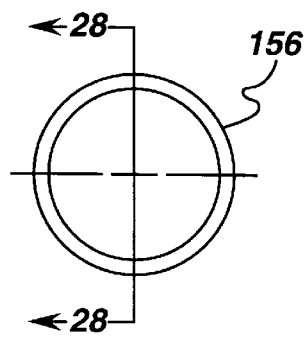
FIG. 27 is a top view of the current sensor coil core for the current sensor shown in FIG. 27.
Figure 28:
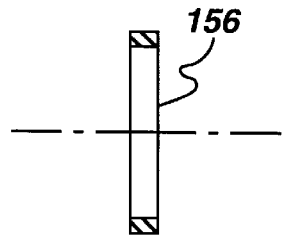
FIG. 28 is a cross-sectional view along line 28—28 shown in FIG. 27.

FIG. 27 is a top view of current sensing core 156. Current sensing core 156 is substantially ring-shaped and is formed of an insulator, such as a plastic. FIG. 28 is a cross-sectional view of current sensing core 156 taken along line 28—28 shown in FIG. 27. Core 156 is hollow, as shown in FIG. 28.

To monitor current in a power line with current sensor 150 (FIG. 18), the power line is passed through power line opening 154, as indicated in FIG. 19. When current sensor 150 and the power line are assembled as described above, current sensing core 156 and coil 180 and power-up core 158 and coil (not shown) are substantially symmetric with respect to the power line.

In operation, the magnetic field generated by current in the power line induces a voltage in current sensing coil 180 and also induces a current in the power-up coil. The induced voltage in current sensing coil 180 is proportional to the time rate of change of the current in the power conductor, and the current induced in current sensing coil 180 is provided to a sensing circuit which generates an output signal used for controlling the power system.

The induced current in the power-up coil is used to energize the sensing circuit components. For example, the power-up coil may be electrically connected to a power rectifier and control circuit which, in turn, may be connected to supply power to other components of the breaker unit.

The above described current sensors can be used in various applications, such as circuit breaker applications. The current sensors can provide an accurate signal representative of current in a power conductor, and require relatively low material and assembly costs. Further, the current sensors are small and readily adapted for existing applications.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A self-powered axial current sensor, comprising:

a housing having a conductor opening extending longitudinally therethrough;

an air core current sensing coil located within said housing and disposed substantially symmetrically with respect to a center axis of said conductor opening; and a power coil core having a power-supplying coil wound thereon, said power coil core being located within said housing and disposed substantially symmetrically with respect to the center axis of said conductor opening;

said sensing coil core being situated within an inner periphery of said power coil core.

2. A self-powered axial current sensor in accordance with claim 1 wherein said sensing coil comprises a current sensing coil.

3. A self-powered axial current sensor in accordance with claim 2 further comprising a compensating turn on said sensing coil core.

4. A self-powered axial current sensor in accordance with claim 1 wherein said sensing coil core has a substantially rectangular shape.

5. A self-powered axial current sensor in accordance with claim 4 wherein said sensing coil core comprises a plurality of bobbins, each of said bobbins having a substantially rectangular cross sectional shape.

6. A self-powered axial current sensor in accordance with claim 5 wherein each of said bobbins comprises a first end having a first flange and a second end having a second flange, said first and second flanges including first and second interlocking members respectively.

7. A self-powered axial current sensor in accordance with claim 1 wherein said air core sensing coil is substantially ring-shaped.

8. A self-powered axial current sensor in accordance with claim 1 wherein said power supplying coil core has a substantially rectangular shape.

9. A self-powered axial current sensor in accordance with claim 8 wherein said power supplying coil core comprises a plurality of c-cores.

10. A self-powered axial current sensor in accordance with claim 9 wherein said power supplying coil core further comprises at least one coil bobbin, one of said c-cores extending through said coil bobbin.

11. A self-powered axial current sensor in accordance with claim 1 wherein said power supplying coil core is substantially ring-shaped.

12. A self-powered axial current sensor, comprising:

a housing comprising a base including a first retaining wall and a second retaining wall defining a periphery of a current sensing core region, and a base wall which defines, with said second retaining wall, a periphery of a power core region, said current sensing core region being situated inward of said power core region, said housing further comprising a conductor opening extending longitudinally therethrough;

an air core current sensing coil located within said housing current sensing core region and disposed substantially symmetrically with respect to a center axis of said conductor opening; and a power coil core having a power-supplying coil wound thereon and being located within said housing power core region.

13. A self-powered axial current sensor in accordance with claim 12 wherein said housing further comprises a cover configured to be threadedly engaged to said base.

14. A self-powered axial current sensor in accordance with claim 12 wherein said sensing coil comprises a current sensing coil having a compensating turn, said sensing coil core having a substantially rectangular shape.

15. A self-powered axial current sensor in accordance with claim 14 wherein said sensing coil core comprises a plurality of bobbins, each of said bobbins having a substantially rectangular cross sectional shape, each of said bobbins comprising a first end having a first flange and a second end having a second flange, said first and second flanges including first and second interlocking members respectively.

16. A self-powered axial current sensor in accordance with claim 12 wherein said sensing coil comprises a current sensing coil having a compensating turn, said sensing coil core being substantially ring-shaped.

17. A self-powered axial current sensor in accordance with claim 12 wherein said power supplying coil core comprises a plurality of c-cores.

18. A self-powered axial current sensor in accordance with claim 17 wherein said power supplying coil core further comprises at least one coil bobbin, one of said c-cores extending through said coil bobbin.

19. A self-powered axial current sensor in accordance with claim 12 wherein said power supplying coil core is substantially ring-shaped.

\* \* \* \* \*